United States Patent
Wu et al.

(10) Patent No.: US 9,087,579 B1
(45) Date of Patent: Jul. 21, 2015

(54) SENSE AMPLIFIERS EMPLOYING CONTROL CIRCUITRY FOR DECOUPLING RESISTIVE MEMORY SENSE INPUTS DURING STATE SENSING TO PREVENT CURRENT BACK INJECTION, AND RELATED METHODS AND SYSTEMS

(71) Applicant: QUALCOMM Incorporated, San Diego, CA (US)

(72) Inventors: Wenqing Wu, San Diego, CA (US); Venkatasubramanian Narayanan, San Diego, CA (US); Kendrick Hoy Leong Yuen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/165,702

(22) Filed: Jan. 28, 2014

Related U.S. Application Data

(60) Provisional application No. 61/923,887, filed on Jan. 6, 2014.

(51) Int. Cl.
  *G11C 11/00* (2006.01)
  *G11C 13/00* (2006.01)
  *G11C 11/16* (2006.01)

(52) U.S. Cl.
  CPC .......... *G11C 13/004* (2013.01); *G11C 11/1673* (2013.01); *G11C 2013/0042* (2013.01); *G11C 2013/0057* (2013.01)

(58) Field of Classification Search
  CPC .................................................. G11C 13/0069
  USPC .................................. 365/148, 158
  See application file for complete search history.

(56) References Cited

U.S. PATENT DOCUMENTS 6,208,186 B1    3/2001  Nair
6,275,961 B1 *  8/2001  Roohparvar ................... 714/718
6,861,687 B2    3/2005  Hsu et al.

(Continued)

FOREIGN PATENT DOCUMENTS

EP          1225591 A2    7/2002

OTHER PUBLICATIONS

Invitation to Pay Additional Fees and Partial International Search for PCT/US2015/010108, mailed Apr. 24, 2015, 8 pages.

(Continued)

*Primary Examiner* — Michael Tran
(74) *Attorney, Agent, or Firm* — Withrow & Terranova, PLLC

(57) ABSTRACT

Sense amplifiers employing control circuitry for decoupling resistive memory sense inputs during state sensing to prevent current back injection, and related methods and systems are disclosed. In one embodiment, sense amplifier is provided. The sense amplifier comprises a differential sense input coupled to bit line. The sense amplifier also comprises a differential reference input coupled to reference line. First inverter inverts first inverter input into first inverter output coupled to second inverter input of second inverter, first inverter output configured to provide state of bitcell. Second inverter inverts second inverter input into second inverter output coupled to first inverter input. Control circuit couples differential reference input to first inverter and differential sense input to second inverter in latch mode, and decouples differential reference input to first inverter and differential sense input to second inverter in sensing mode to provide sensed state of bitcell on first inverter output.

25 Claims, 8 Drawing Sheets

(56) References Cited

U.S. PATENT DOCUMENTS

| | | |
|---|---|---|
| 6,873,559 B2 | 3/2005 | Ueda |
| 8,018,754 B1 * | 9/2011 | Evans et al. .................. 365/145 |
| 8,098,511 B2 | 1/2012 | Scheuerlein et al. |
| 8,159,864 B2 * | 4/2012 | Yoon et al. .................... 365/158 |
| 8,270,193 B2 | 9/2012 | Siau et al. |
| 2001/0043089 A1 | 11/2001 | Forbes et al. |
| 2006/0146593 A1 | 7/2006 | Klehn et al. |
| 2007/0147160 A1 | 6/2007 | Hanzawa et al. |
| 2008/0074914 A1 | 3/2008 | Fang et al. |
| 2009/0102561 A1 | 4/2009 | Murin et al. |
| 2009/0122630 A1 | 5/2009 | Takahashi |
| 2009/0168540 A1 | 7/2009 | Nguyen et al. |
| 2010/0039851 A1 | 2/2010 | Morita et al. |
| 2010/0110814 A1 | 5/2010 | Shimogawa et al. |
| 2010/0195366 A1 | 8/2010 | Chen et al. |
| 2011/0310684 A1 | 12/2011 | Yamagami |

OTHER PUBLICATIONS

Zhang, Yaojun et al., "Adams: Asymmetric Differential STT-RAM Cell Structure for Reliable and High—performance Applications," Presented at the International Conference on Computer-Aided Design, Nov. 18-21, 2013, San Jose, California, IEEE, pp. 9-16.
International Search Report and Written Opinion for PCT/US2015/010108 mailed Jun. 3, 2015, 23 pages.

* cited by examiner

| | | EXEMPLARY CLSA 1 (264) | EXEMPLARY CLSA 2 (266) | SENSE AMPLIFIER (150) |
|---|---|---|---|---|
| | Vm, Vs (V) | Fail Count (out of 100 sims), Sensing Delay | | |
| Simulation over 100 points/cases. | 100, 10 | 100, >145 | 100, >145 | 0, 1.19 |
| | 250, 10 | 100, >145 | 100, >145 | 0, 1.20 |
| | 300, 10 | 21, 137 | 22, 140 | 0, 1.18 |
| | 500, 10 | 19, 5.71 | 22, 5.53 | 0, 1.11 |
| | 1000, 10 | 16, 1.66 | 20, 1.60 | 0, 1.08 |
| | 1500, 10 | 14, 1.26 | 20, 1.27 | 0, 1.08 |
| | 2000, 10 | 18, 1.22 | 16, 1.25 | 1, 1.08 |
| | 2400, 10 | 19, 1.20 | 21, 1.16 | 1, 1.11 |
| | 100, -10 | 0, 0.00 | 0, 0.00 | 0, 1.12 |
| | 250, -10 | 0, 0.00 | 0, 0.00 | 0, 1.11 |
| | 300, -10 | 19, 145 | 19, 140 | 0, 1.10 |
| | 500, -10 | 25, 6.42 | 25, 6.06 | 0, 0.80 |
| | 1000, -10 | 23, 1.61 | 21, 1.51 | 0, 1.04 |
| | 1500, -10 | 24, 1.17 | 22, 1.15 | 0, 1.05 |
| | 2000, -10 | 26, 1.13 | 19, 1.07 | 0, 1.05 |
| | 2400, -10 | 27, 1.16 | 24, 1.09 | 0, 1.05 |

*FIG. 7*

SENSE AMPLIFIERS EMPLOYING CONTROL CIRCUITRY FOR DECOUPLING RESISTIVE MEMORY SENSE INPUTS DURING STATE SENSING TO PREVENT CURRENT BACK INJECTION, AND RELATED METHODS AND SYSTEMS

PRIORITY APPLICATION

The present application claims priority to U.S. Provisional Patent Application Ser. No. 61/923,887 filed on Jan. 6, 2014 and entitled "SENSE AMPLIFIERS EMPLOYING CONTROL CIRCUITRY FOR DECOUPLING RESISTIVE MEMORY SENSE INPUTS DURING STATE SENSING TO PREVENT CURRENT BACK INJECTION, AND RELATED METHODS AND SYSTEMS," which is incorporated herein by reference in its entirety.

BACKGROUND

I. Field of the Disclosure

The technology of the disclosure relates generally to sense amplifiers in memory systems used to read data from memory.

II. Background

Processor-based computer systems include memory for data storage. Memory systems are generally composed of memory bitcells capable of storing data, and corresponding circuitry used to read and write such data. In particular, sense amplifiers (also referred to as "sense amps") are circuits commonly employed within memory systems to read stored electrical states (e.g., voltage) stored within memory bitcells. The stored electrical states represent logical values or data. More specifically, a sense amplifier is configured to output a logical value (e.g., a logical '0' or logical '1') based on the electrical state of a particular memory bitcell during a memory read operation.

In this regard, FIG. 1 illustrates an exemplary memory system 10 that includes sense amplifiers 12 as part of its read circuitry. For example, the memory system 10 may be a Static Random Access Memory (SRAM) system. Input lines 14 carry signals to allow command and data communications between the memory system 10 and other system components that write or read data to and from a memory cell array 16, which operates as a mass memory device. More specifically, to read data from the memory cell array 16, a memory access request 18 is provided to the memory system 10 by way of the input lines 14. Further, output lines 20 carry signals provided by the memory system 10 as the result of an operation, such as the memory access request 18, to other system components. The memory cell array 16 may be comprised of memory bitcells (not shown). A control system 22 controls the operation of the memory cell array 16. For the memory access request 18, word line drivers 24 in the memory system 10 select a specific row (i.e., page) (not shown) of memory bitcells within the memory cell array 16 based on address information corresponding to the memory access request 18 determined by the control system 22. The address information identifies a specific row in the memory cell array 16 to be read. In response, data from the selected row in the memory cell array 16 is placed onto bit lines 26. In order to read the data placed onto the bit lines 26, the control system 22 communicates a sense signal 28 to the sense amplifiers 12. The sense amplifiers 12 compare the sense signal 28 to the data on the bit lines 26 to provide logical values to the output lines 20. The logical values on the output lines 20 represent the stored states in each corresponding memory bitcell.

While sense amplifiers are commonly associated with SRAM systems, sense amplifiers are also employed within resistive memory systems. As a non-limiting example, sense amplifiers may be used in Magnetic Random Access Memory (MRAM) systems that utilize Spin Transfer Torque (STT) Magnetic Tunnel Junctions (MTJ) (STT-MTJ). In this manner, FIG. 2 illustrates an exemplary MRAM system 30 employing a STT-MTJ 32 and a sense amplifier 34. The STT-MTJ 32 represents only one of a plurality of bitcells within a memory column (not shown) in the MRAM system 30. Further, the sense amplifier 34 shown in FIG. 2 is provided for the memory column of the MRAM system 30 to read the bitcell within a memory row (not shown) selected by a word line 36 for the memory column during a memory access request. Data is stored in the STT-MTJ 32 according to the magnetic orientation between two layers: a free layer 38 disposed above a fixed or pinned layer 40. The free and pinned layers 38, 40 are separated by a tunnel junction 42 formed by a thin non-magnetic dielectric layer.

With continuing reference to FIG. 2, when reading data stored in the STT-MTJ 32, the word line 36 is activated for an access transistor 44 to allow current to flow through the STT-MTJ 32 between electrodes 46 and 48. To ensure that the data value stored within the STT-MTJ 32 is not disturbed during a read operation, a read bias generator 50 is used to control the current provided across the electrodes 46 and 48 when sensing using a bit line 52 and a voltage source 54. A low resistance, as measured by voltage applied on the bit line 52 divided by the measured current, is associated with a P orientation between the free and pinned layers 38, 40. A higher resistance is associated with an AP orientation between the free and pinned layers 38, 40. In particular, the sense amplifier 34 determines the presence of a low or high resistance by comparing the voltage or current of the bit line 52 with the voltage or current provided by a reference voltage supply 56. Thus, if a low resistance is measured, the sense amplifier 34 provides a logical '0' to a sensed state output 58 representing a data value of logical '0' stored within the STT-MTJ 32. Conversely, if a high resistance is measured, the sense amplifier 34 provides a logical '1' to the sensed state output 58 representing a data value of logical '1' stored within the STT-MTJ 32. Thus, the sense amplifier 34 in the MRAM system 30 plays a vital role in reading the data value stored in the STT-MTJ 32.

A current latch-based sense amplifier (CLSA) is one type of sense amplifier that can be used in resistive memory systems, such as the MRAM system 30 in FIG. 2, for example. The CLSA provides logical values as outputs by comparing the strength of a current on a bit line corresponding to a resistive bitcell to the current on a reference line. The logical value on a first CLSA output represents the state stored in the corresponding resistive bitcell, while the logical value on a second CLSA output represents the complement of the stored state. One advantage of the CLSA is that it does not cause read disturbance within a corresponding memory bitcell due to back injection of the sensing current. Such back injection is avoided in the CLSA because the bit line of the resistive bitcell is isolated from the sensing circuitry. However, one disadvantage of the CLSA is that it requires a long sensing time when the bit line of the corresponding bitcell has a lower current. A long sensing time can interfere with the stored state in the corresponding bitcell, thus causing read disturbance. Further, the CLSA has a limited sensing range because it is not useful for sensing at lower voltage levels. Such a limited sensing range causes the CLSA to possess a low tolerance range in relation to overcoming device mismatches of its internal transistors that can be caused by manufacturing process variations.

An alternative type of sense amplifier to a CLSA that can be used within resistive memory systems, such as the MRAM system 30 in FIG. 2 for example, is a voltage latch-based sense amplifier (VLSA). The VLSA can provide accurate and fast sensing at lower voltage levels. The VLSA provides logical values as outputs by comparing the strength of a voltage on a bit line corresponding to a resistive bitcell to that on a reference line. The logical value on a first VLSA output represents the state stored in a corresponding resistive bitcell, while the logical value on a second VLSA output represents the complement of the stored state. One disadvantage of the VLSA is that it may cause read disturbance within a corresponding resistive bitcell due to back injection of the sensing current. More specifically, the bit line of the resistive bitcell is not isolated from the sensing voltage within the VLSA, potentially allowing the sensing voltage to interfere with the state stored in the corresponding resistive bitcell. However, the VLSA provides particular advantages, as well. For example, unlike in the CLSA, the speed at which the bit line voltage of the resistive bitcell is sensed does not depend on the bit line voltage level. Therefore, the VLSA is capable of sensing at lower voltage levels, and thus has a larger sensing range. Such a large sensing range provides the VLSA with a high tolerance range in relation to device mismatches of its internal transistors caused by manufacturing process variations.

As previously described, the CLSA and the VLSA each possess their respective advantages and disadvantages. For example, while the CLSA does not suffer from read disturbance caused by back injection of the sensing current, it does not have a large tolerance range and may not perform as desired when sensing lower voltage levels. Conversely, the VLSA has a large tolerance range and performs well when sensing lower voltage levels, but it is susceptible to read disturbance caused by back injection. Thus, it would be advantageous to employ a sense amplifier with a large tolerance range that performs well when sensing lower voltage levels, and that also avoids read disturbance caused by back injection.

SUMMARY OF THE DISCLOSURE

Embodiments disclosed in the detailed description include sense amplifiers employing control circuitry for decoupling resistive memory sense inputs during state sensing to prevent current back injection, and related methods and systems. The speed and accuracy of resistive memory systems may be improved by employing sense amplifiers (also referred to as "sense amps") that are able to sense an electrical state stored in a memory bitcell at lower voltage levels, while also preventing read disturbance caused by back injection of the sensing current. In this regard in one embodiment, as will be discussed in more detail below, a sense amplifier is disclosed that implements a latch mode and a sensing mode using control circuitry to achieve low voltage sensing without current back injection. More specifically, the sense amplifier receives as inputs a bit line of a resistive memory bitcell and a reference line from a reference voltage source. The sense amplifier senses the difference between the voltage on the bit line as compared to the voltage on the reference line in order to determine the logical state stored within the resistive memory bitcell. In this manner, a control circuit in the sense amplifier is configured to couple the bit line and the reference line to the sense amplifier during the latch mode (e.g., when the sense amplifier is not sensing). Further, the control circuit is configured to decouple the bit line and the reference line from the sense amplifier during the sensing mode. This decoupling isolates the bit line from the sense amplifier during the sensing mode, thus preventing back injection of the sensing current into the resistive memory bitcell. Additionally, during the sensing mode, the sense amplifier provides an output representing the state stored in the resistive memory bitcell. Using the control circuit to implement the latch mode and the sensing mode in this manner allows the sense amplifier to sense at lower voltage levels, while also preventing current back injection. Further, this also provides the sense amplifier with a larger tolerance to overcome device mismatch due to manufacturing process variations.

In this regard in one embodiment, a sense amplifier for sensing a state of a resistive memory bitcell is provided. The sense amplifier comprises a differential sense input, the differential sense input configured to be coupled to a bit line of a resistive memory bitcell. The sense amplifier further comprises a differential reference input, the differential reference input configured to be coupled to a reference line. The sense amplifier further comprises a first inverter configured to invert a first inverter input into a first inverter output coupled to a second inverter input of a second inverter, the first inverter output configured to provide a sensed state of the resistive memory bitcell. The second inverter is configured to invert the second inverter input into a second inverter output coupled to the first inverter input. The sense amplifier further comprises a control circuit configured to couple the differential reference input to the first inverter and the differential sense input to the second inverter in a latch mode of the resistive memory bitcell, and decouple the differential reference input to the first inverter and the differential sense input to the second inverter in a sensing mode of the resistive memory bitcell to provide the sensed state of the resistive memory bitcell on the first inverter output.

In another embodiment, a memory system is provided. The memory system comprises a memory array comprised of a plurality of resistive memory bitcells. The memory system further comprises a plurality of sense amplifiers, wherein each sense amplifier of the plurality of sense amplifiers corresponds to a column of the memory array, and is configured to sense a state of a resistive memory bitcell within a selected row of the memory array of the corresponding column. Each sense amplifier of the plurality of sense amplifiers comprises a differential sense input, the differential sense input configured to be coupled to a bit line of the resistive memory bitcell. Each sense amplifier further comprises a differential reference input, the differential reference input configured to be coupled to a reference line. Each sense amplifier further comprises a first inverter configured to invert a first inverter input into a first inverter output coupled to a second inverter input of a second inverter, the first inverter output configured to provide a sensed state of the resistive memory bitcell. The second inverter is configured to invert the second inverter input into a second inverter output coupled to the first inverter input. Each sense amplifier further comprises a control circuit configured to couple the differential reference input to the first inverter and the differential sense input to the second inverter in a latch mode of the resistive memory bitcell and decouple the differential reference input to the first inverter and the differential sense input to the second inverter in a sensing mode of the resistive memory bitcell to provide the sensed state of the resistive memory bitcell on the first inverter output.

In another embodiment, a method for sensing a state of a resistive memory bitcell is provided. The method comprises providing a differential sense input, the differential sense input comprising a bit line of a resistive memory bitcell. The method further comprises providing a differential reference input, the differential reference input comprising a reference line. The method further comprises inverting, by a first inverter, a first inverter input into a first inverter output coupled to a second inverter input of a second inverter, the first inverter output configured to provide a sensed state of the resistive memory bitcell. The method further comprises inverting, by the second inverter, the second inverter input into a second inverter output coupled to the first inverter input. The method further comprises coupling the differential reference input to the first inverter and the differential sense input to the second inverter in a latch mode of the resistive memory bitcell. The method further comprises decoupling the differential reference input to the first inverter and the differential sense input to the second inverter in a sensing mode of the resistive memory bitcell to provide the sensed state of the resistive memory bitcell on the first inverter output.

BRIEF DESCRIPTION OF THE FIGURES

FIG. 7 is a chart illustrating exemplary fail count and sensing delay experienced within the sense amplifier in FIG. 5 as compared to two (2) exemplary CLSAs existing in the prior art.

DETAILED DESCRIPTION

Figure 1:
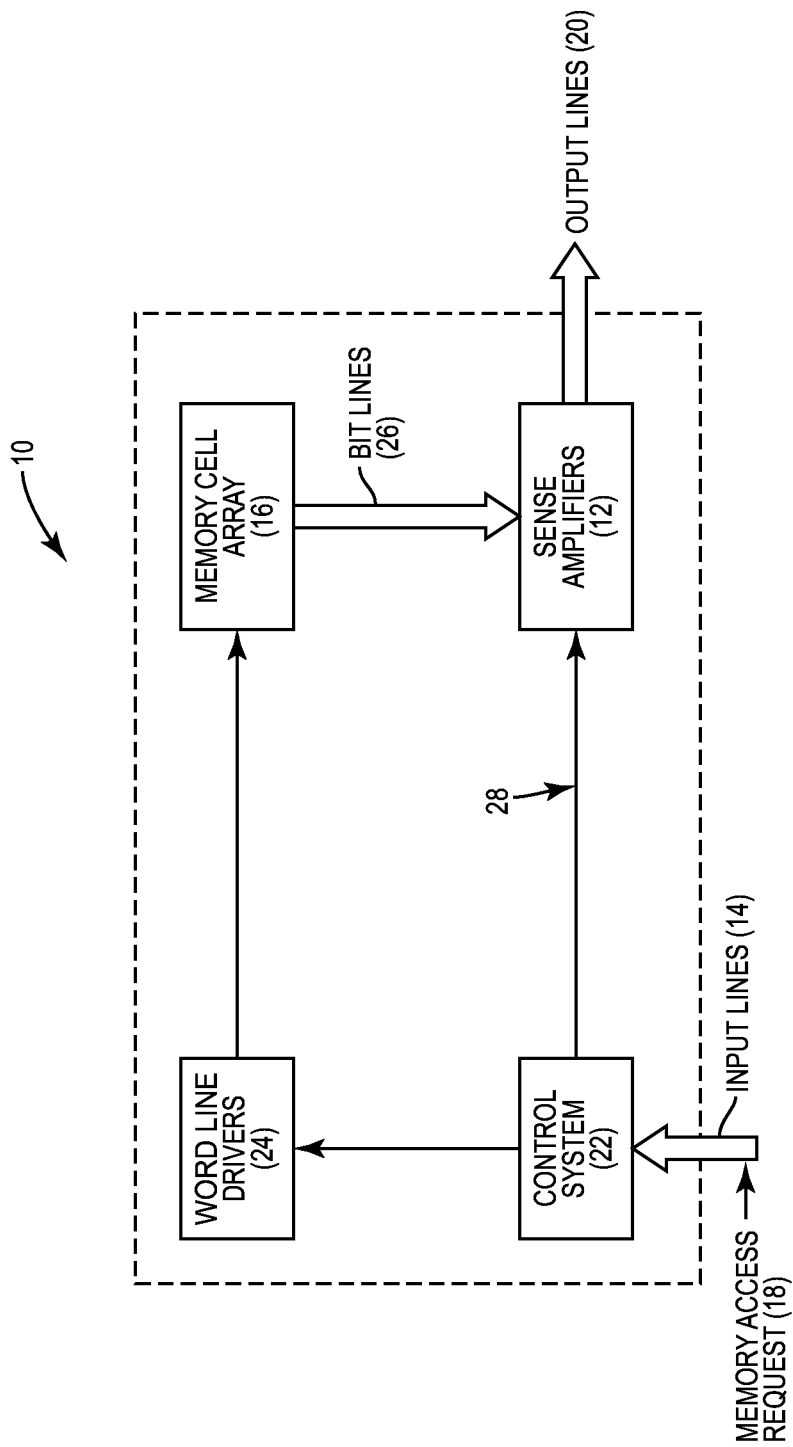
FIG. 1 is an illustration of an exemplary memory system that employs sense amplifiers for use in memory access requests.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include sense amplifiers employing control circuitry for decoupling resistive memory sense inputs during state sensing to prevent current back injection, and related methods and systems. The speed and accuracy of resistive memory systems may be improved by employing sense amplifiers (also referred to as "sense amps") that are able to sense at lower voltage levels, while also preventing read disturbance caused by back injection of the sensing current. In this regard in one embodiment, as will be discussed in more detail below, a sense amplifier is disclosed that implements a latch mode and a sensing mode using control circuitry to achieve low voltage sensing without current back injection. More specifically, the sense amplifier receives a bit line of a resistive memory bitcell and a reference line from a reference voltage source as inputs. The sense amplifier senses the difference between the voltage on the bit line as compared to the voltage on the reference line in order to determine the logical state stored within the resistive memory bitcell. In this manner, a control circuit in the sense amplifier is configured to couple the bit line and the reference line to the sense amplifier during the latch mode (e.g., when the sense amplifier is not sensing). Further, the control circuit is configured to decouple the bit line and the reference line from the sense amplifier during the sensing mode. This decoupling isolates the bit line from the sense amplifier during the sensing mode, thus preventing back injection of the sensing current into the resistive memory bitcell. Additionally, during the sensing mode, the sense amplifier provides an output representing the state stored in the resistive memory bitcell. Using the control circuit to implement the latch mode and the sensing mode in this manner allows the sense amplifier to sense at lower voltage levels, while also preventing current back injection. Further, this also provides the sense amplifier with a larger tolerance to overcome device mismatch due to manufacturing process variations.

Figure 3:
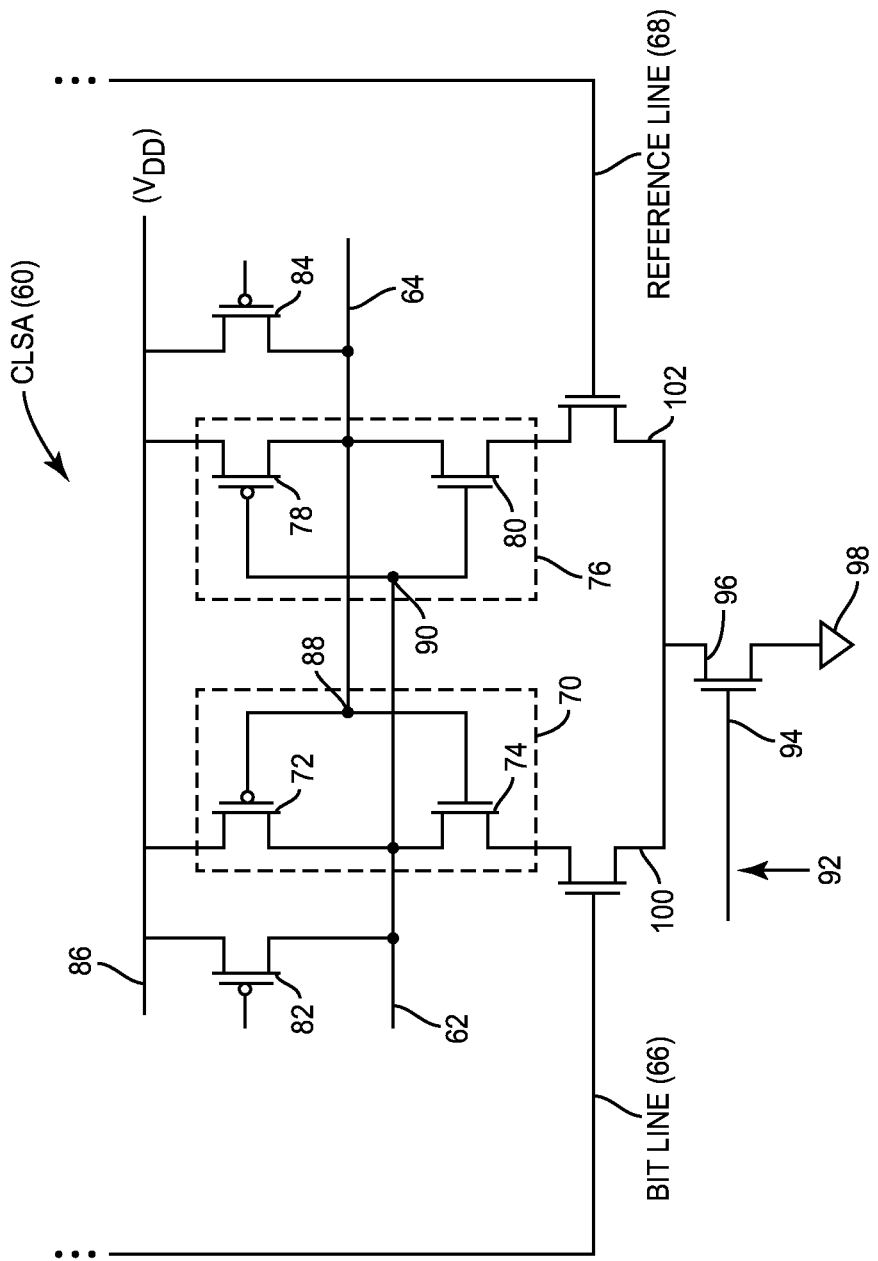
FIG. 3 is a transistor-level diagram of an exemplary current latch-based sense amplifier (CLSA) that may be employed as a sense amplifier in the MRAM system in FIG. 2.
Figure 4:
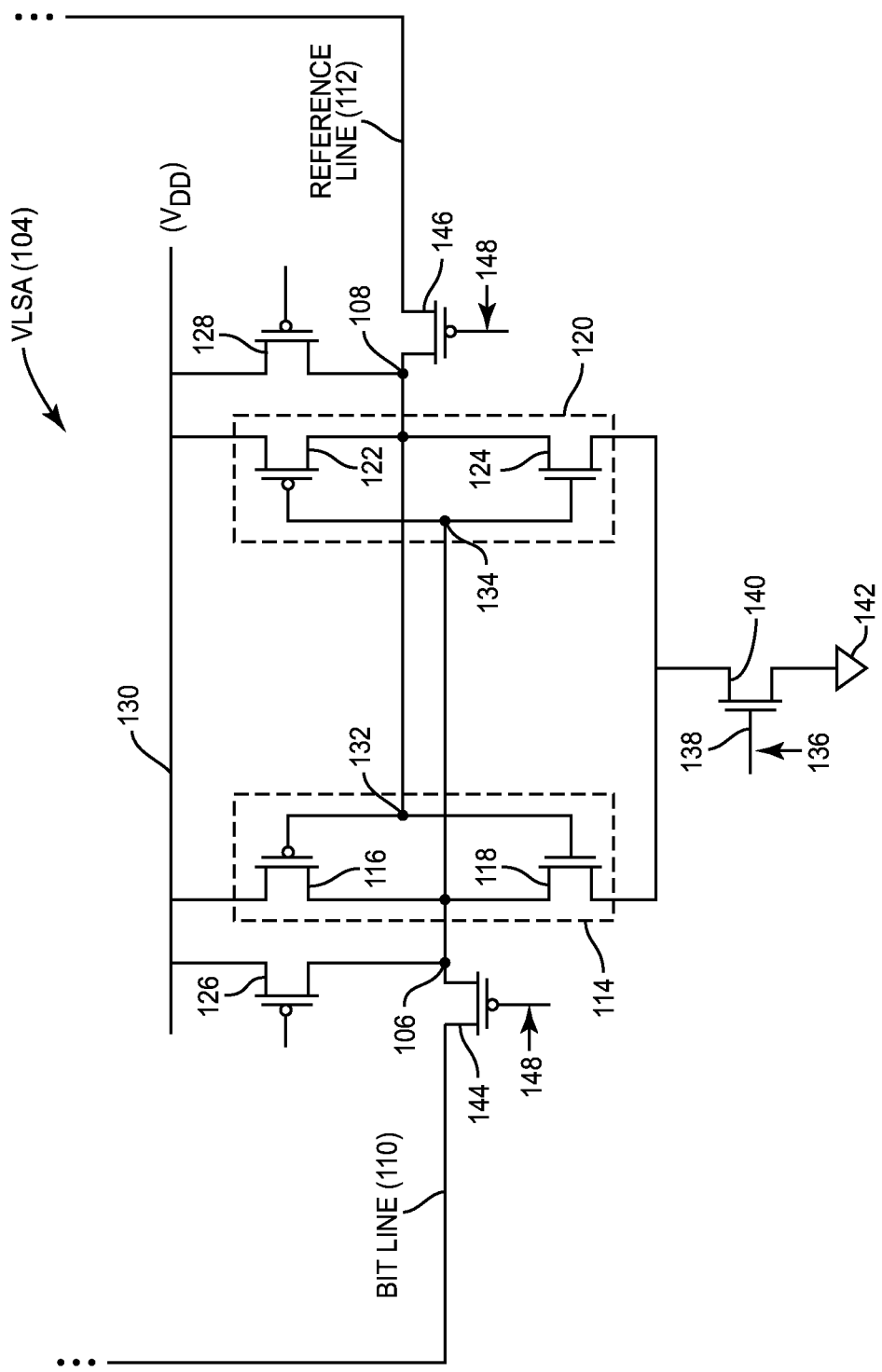
FIG. 4 is a transistor-level diagram of an exemplary voltage latch-based sense amplifier (VLSA) that may be employed as a sense amplifier in the MRAM system in FIG. 2.
Figure 5:
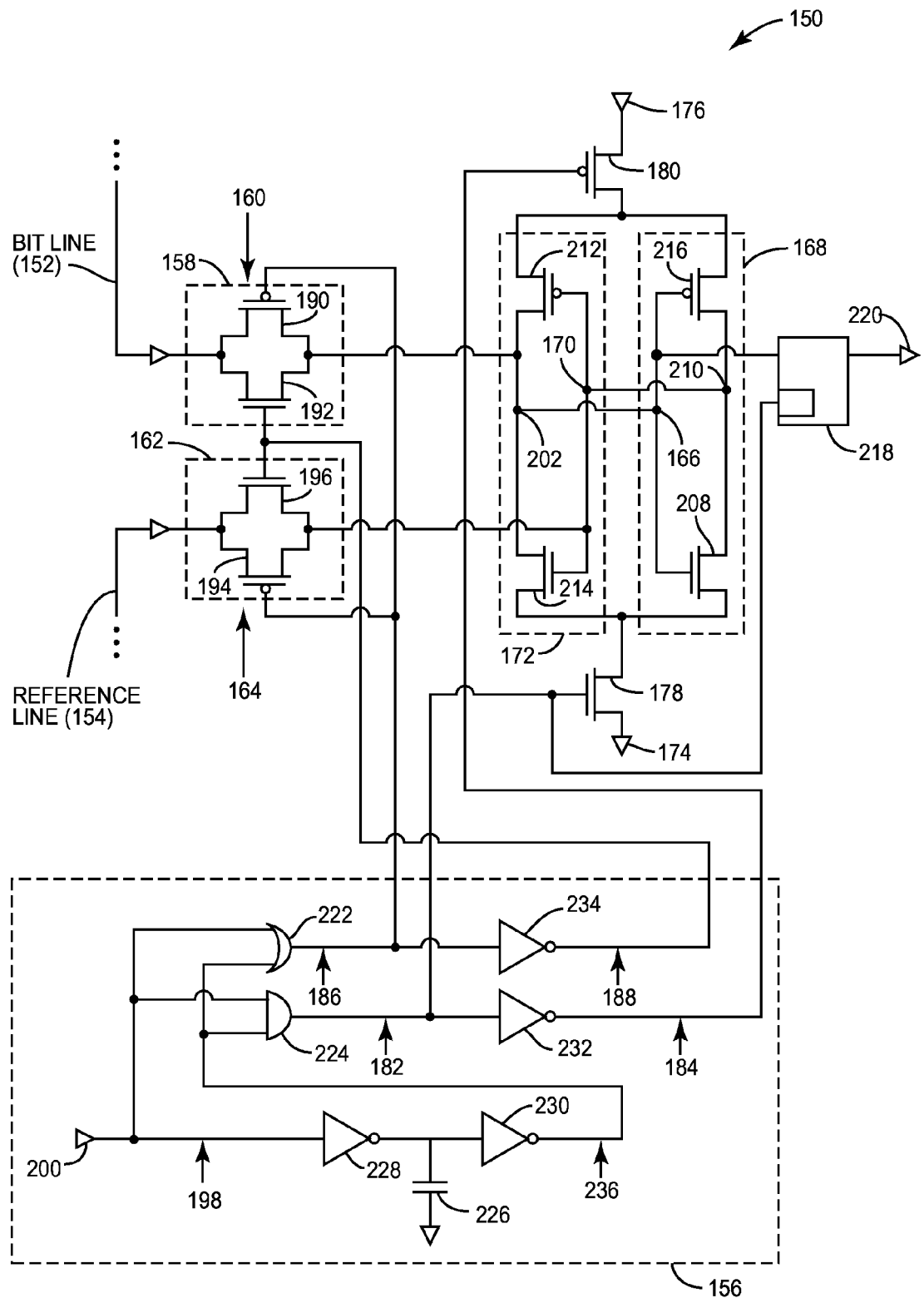
FIG. 5 is a diagram of an exemplary sense amplifier employing control circuitry for decoupling resistive memory sense inputs during state sensing to prevent current back injection.

In this manner, before discussing sense amplifiers employing control circuitry for decoupling resistive memory sense inputs during state sensing to prevent current back injection starting at FIG. 5, sense amplifiers existing in the prior art are first described with regard to FIGS. 3 and 4. More specifically, the current latch-based sense amplifier (CLSA) and the voltage latch-based sense amplifier (VLSA) are described in detail below.

Figure 2:
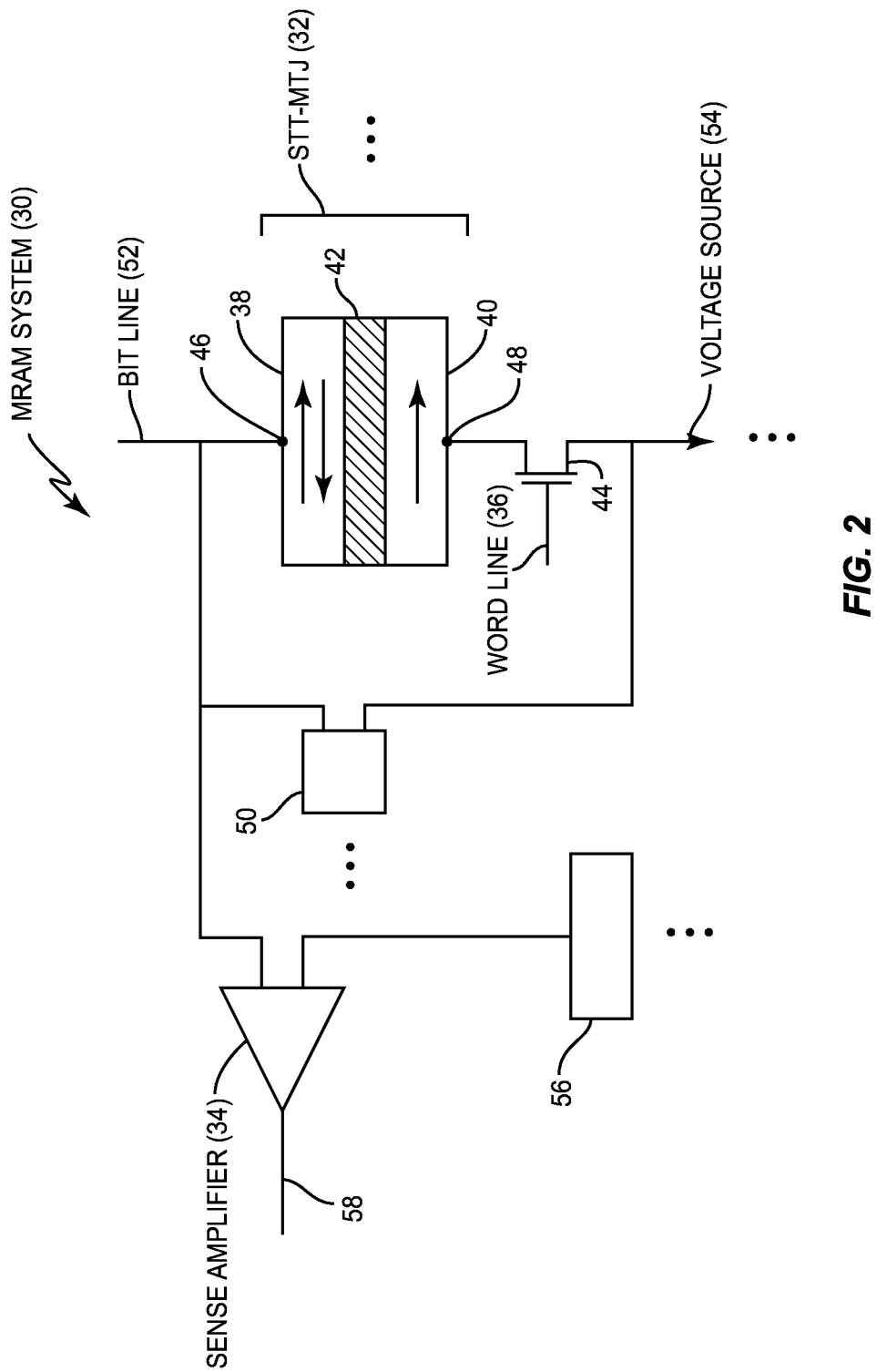
FIG. 2 is a diagram of an exemplary Magnetic Random Access Memory (MRAM) system employing a Spin Torque Transfer (STT) Magnetic Tunnel Junction (MTJ) (STT-MTJ) in conjunction with a sense amplifier.

In this regard, a CLSA is one type of sense amplifier that can be used in resistive memory systems, such as the MRAM system 30 in FIG. 2, for example. As an example, FIG. 3 illustrates a transistor-level diagram of a CLSA 60. The CLSA 60 provides logical values on a CLSA output 62 and a CLSA output 64 by comparing the strength of a current on a bit line 66 corresponding to a resistive bitcell (not shown) to the current on a reference line 68, respectively. The logical value on the CLSA output 62 represents the state stored in the corresponding resistive bitcell, while the logical value on the CLSA output 64 represents the complement of the stored state.

More specifically, the CLSA 60 includes a first inverter 70, composed of a P-Type Metal Oxide Semiconductor (PMOS) transistor 72 and an N-Type Metal Oxide Semiconductor (NMOS) transistor 74, cross-coupled to a second inverter 76, composed of a PMOS transistor 78 and an NMOS transistor 80. Prior to sensing, an access PMOS transistor 82 and an access PMOS transistor 84 are activated so that a voltage equal to $V_{DD}$ on a voltage rail 86 equalizes the first inverter 70 and the second inverter 76. This is achieved by pulling up an input 88 of the first inverter 70 and an input 90 of the second inverter 76 to $V_{DD}$.

To begin sensing, the access PMOS transistor 82 and the access PMOS transistor 84 are deactivated, and a sense enable signal 92 is asserted on a sense enable 94. Assertion on the sense enable 94 activates an NMOS transistor 96 coupled to a ground source 98. The NMOS transistor 96 is also coupled to an NMOS transistor 100 and an NMOS transistor 102, which are coupled to the bit line 66 and the reference line 68, respectively. If a stronger current is provided by the bit line 66 than the current provided by the reference line 68, the NMOS transistor 100 "closes" more than the NMOS transistor 102. This causes the ground source 98 to pull the input 90 of the second inverter 76 to a lower voltage than the input 88 of the first inverter 70. As a result, the CLSA output 62 provides a logical '0' value, while the CLSA output 64 provides a logical '1' value. This indicates that a logical '0' value is stored within the corresponding bitcell. Conversely, if the current provided by the reference line 68 is stronger than the current provided by the bit line 66, the NMOS transistor 102 "closes" more than the NMOS transistor 100. This causes the ground source 98 to pull the input 88 of the first inverter 70 to a lower voltage than the input 90 of the second inverter 76. As a result, the CLSA output 62 provides a logical '1' value, while the CLSA output 64 provides a logical '0' value. This indicates that a logical '1' is stored within the corresponding bitcell. Therefore, the CLSA 60 produces a logical value representing a state stored within a resistive bitcell by allowing the first inverter 70 and the second inverter 76 to "compete" to determine which possesses a stronger current.

As previously described, one advantage of the CLSA 60 in FIG. 3 is that it does not cause read disturbance within a corresponding memory bitcell due to back injection of the sensing current. Read disturbance is an erroneous change in the state stored within a memory bitcell. Because the bit line 66 is coupled to the gate of the NMOS transistor 100, as opposed to its source or drain, the sensing current within the CLSA 60 is isolated from the bit line 66, and thus cannot interfere with the state stored in the corresponding memory bitcell. However, the CLSA 60 suffers from particular disadvantages, as well. For example, because the bit line 66 activates the NMOS transistor 100, the CLSA 60 requires a long sensing time when the bit line 66 has a lower current. More specifically, the lower current produces a voltage near or lower than the threshold voltage required to activate the gate of the NMOS transistor 100, which results in a longer activation time. The longer activation time in turn increases the sensing time, which requires the sensing current to be applied to the memory bitcell for a longer period of time. In this manner, a long sensing time may also cause read disturbance. Therefore, the CLSA 60 has a limited sensing range because it is not useful for sensing at lower voltage levels. Further, such a limited sensing range, combined with the fact that a transistor's transconductance (i.e., a gate voltage-induced source-drain conductance change) is sensitive to changes in threshold voltage, causes the CLSA 60 to possess a low tolerance range in relation to overcoming device mismatches of its internal transistors that can be caused by manufacturing process variations. A low tolerance range can make the CLSA 60 more susceptible to read errors as compared to sense amplifiers that have a higher tolerance range.

An alternative type of sense amplifier to a CLSA that can be used within resistive memory systems, such as the MRAM system 30 in FIG. 2 for example, is a VLSA. As discussed below, unlike the CLSA 60 in FIG. 3, a VLSA provides accurate and fast sensing at lower voltage levels. In this regard, FIG. 4 illustrates a transistor-level diagram of a VLSA 104. The VLSA 104 provides logical values on a VLSA output 106 and a VLSA output 108 by comparing the strength of a voltage on a bit line 110 to a voltage on a reference line 112. The logical value on the VLSA output 106 represents the state stored in a corresponding resistive bitcell, while the logical value on the VLSA output 108 represents the complement of the stored state.

More specifically, the VLSA 104 includes a first inverter 114, composed of a PMOS transistor 116 and an NMOS transistor 118, cross-coupled to a second inverter 120, composed of a PMOS transistor 122 and an NMOS transistor 124.

Similar to the CLSA 60 in FIG. 3, prior to sensing, an access PMOS transistor 126 and an access PMOS transistor 128 are activated so that a voltage equal to $V_{DD}$ on a voltage rail 130 equalizes the first inverter 114 and the second inverter 120. This is achieved by pulling up an input 132 of the first inverter 114 and an input 134 of the second inverter 120 to $V_{DD}$.

To begin sensing, the access PMOS transistor 126 and the access PMOS transistor 128 are deactivated, and a sense enable signal 136 is asserted on a sense enable 138. Assertion on the sense enable 138 activates an NMOS transistor 140 coupled to a ground source 142, which pulls down the voltage latched within the first inverter 114 and the second inverter 120. A PMOS transistor 144 and a PMOS transistor 146 are coupled to the bit line 110 and the reference line 112, respectively. However, rather than activating the PMOS transistors 144 and 146, the bit line 110 and the reference line 112 are provided as inputs to the second inverter 120 and the first inverter 114, respectively, when an activation signal 148 activates the PMOS transistors 144 and 146. This causes the voltage provided to the first inverter 114 to "compete" directly with the voltage provided to the second inverter 120. If the bit line 110 voltage is higher than the reference line 112 voltage, the input 134 of the second inverter 120 receives a stronger voltage than the input 132 of the first inverter 114. As a result, the VLSA output 106 provides a logical '1' value, while the VLSA output 108 provides a logical '0' value. This indicates that a logical '1' value is stored within the corresponding bitcell. Conversely, if the reference line 112 voltage is stronger than the bit line 110 voltage, the input 132 of the first inverter 114 receives a stronger voltage than the input 134 of the second inverter 120. As a result, the VLSA output 106 provides a logical '0' value, while the VLSA output 108 provides a logical '1' value. This indicates that a logical '0' value is stored within the corresponding bitcell. Therefore, the VLSA 104 produces a logical value representing a state stored within a resistive memory bitcell by allowing the first inverter 114 and the second inverter 120 to "compete" to determine which possesses a stronger voltage.

One disadvantage of the VLSA 104 in FIG. 4 is that it may cause read disturbance within a corresponding memory bitcell due to back injection of the sensing current. More specifically, because the bit line 110 is coupled to the source of the PMOS transistor 144, as opposed to its gate, the sensing voltage within the VLSA 104 is not isolated from the bit line 110, and thus may interfere with the state stored in the corresponding memory bitcell. However, the VLSA 104 provides particular advantages, as well. For example, because the activation signal 148 activates the PMOS transistor 144, the switching speed of the PMOS transistor 144 may be faster than if it were activated by the bit line 110 voltage at a lower voltage. More specifically, the switching speed may be faster because the activation signal 148 can be set to always meet or exceed a threshold voltage of the PMOS transistor 144, while the bit line 110 voltage may not always be at such a high level. A fast switching speed for the PMOS transistor 144 results in a shorter time required for sensing. Additionally, because the PMOS transistor 144 is activated by the activation signal 148 rather than by the bit line 110, the VLSA 104 can provide sensing even when the bit line 110 possesses a lower voltage level. Therefore, the VLSA 104 is capable of sensing across a broad range of voltage levels, and thus has a high tolerance range in relation to device mismatches of its internal transistors caused by manufacturing process variations. The high tolerance range makes the VLSA 104 less susceptible to read errors as compared to sense amplifiers that have a lower tolerance range.

As previously described, the CLSA 60 in FIG. 3 and the VLSA 104 in FIG. 4 each possess their respective advantages and disadvantages over each other. For example, while the CLSA 60 in FIG. 3 does not suffer from read disturbance caused by back injection of the sensing current, it does not have a large tolerance range and performs poorly when sensing lower voltage levels. Conversely, the VLSA 104 in FIG. 4 has a large tolerance range and performs well when sensing lower voltage levels, but it is susceptible to read disturbance caused by back injection. Thus, it would be advantageous to employ a sense amplifier with a large tolerance range that performs well when sensing lower voltage levels, and that also avoids read disturbance caused by back injection.

In this manner, FIG. 5 illustrates an exemplary sense amplifier 150 employing control circuitry for decoupling resistive memory sense inputs during state sensing to prevent current back injection. The sense amplifier 150 can be used in memory systems employing various types of memory, such as Resistive Random Access Memory (ReRAM) or MRAM such as the MRAM system 30 in FIG. 2, as non-limiting examples. In this embodiment, the sense amplifier 150 implements a latch mode and a sensing mode using control circuitry to achieve low voltage sensing without current back injection. More specifically, the sense amplifier 150 receives a bit line 152 of a resistive memory bitcell and a reference line 154 from a reference voltage source as inputs. The sense amplifier 150 senses the difference between the voltage on the bit line 152 as compared to the voltage on the reference line 154 in order to determine the logical state stored within the resistive memory bitcell. In this manner, a control circuit 156 in the sense amplifier 150 is configured to couple the bit line 152 and the reference line 154 to the sense amplifier 150 during the latch mode (e.g., when the sense amplifier 150 is not sensing). Further, the control circuit 156 is configured to decouple the bit line 152 and the reference line 154 from the sense amplifier 150 during the sensing mode. This decoupling isolates the bit line 152 from the sense amplifier 150 during the sensing mode, and thus prevents back injection of the sensing current into the resistive memory bitcell. Additionally, during the sensing mode, the sense amplifier 150 provides an output representing the state stored in the resistive memory bitcell. Using the control circuit 156 to implement the latch mode and the sensing mode in this manner allows the sense amplifier 150 to sense at lower voltage levels, while also preventing current back injection. Further, this also provides the sense amplifier 150 with a larger tolerance to overcome device mismatch due to manufacturing process variations.

In this regard, the sense amplifier 150 includes a differential sense input 158. The differential sense input 158 comprises a sense pass gate 160 in this embodiment. The differential sense input 158 is coupled to the bit line 152 of a resistive memory bitcell (not shown). Additionally, the sense amplifier 150 includes a differential reference input 162. The differential reference input 162 comprises a reference pass gate 164 in this embodiment. The differential reference input 162 is coupled to the reference line 154 of a reference voltage supply (not shown). The sense pass gate 160 is configured to provide the bit line 152 to an input 166 of a second inverter 168. Similarly, the reference pass gate 164 is configured to provide the reference line 154 to an input 170 of a first inverter 172. Notably, the first inverter 172 and the second inverter 168 are cross-coupled so as to latch the values provided by the bit line 152 and the reference line 154, respectively, during the latch mode.

Further, the sense amplifier 150 includes the control circuit 156 that is configured to couple the reference line 154 to the input 170 of the first inverter 172 and couple the bit line 152 to the input 166 of the second inverter 168 during the latch mode, and also decouple the same during the sensing mode. The control circuit 156 is also configured to couple a low voltage source 174 and a high voltage source 176 to the first inverter 172 and the second inverter 168 during the sensing mode. As described in more detail below, the control circuit 156 is configured to perform such coupling and decoupling with particular timing in order to properly sense a stored state of the resistive memory bitcell.

With continuing reference to FIG. 5, prior to the sense amplifier 150 sensing the state stored in the resistive memory bitcell, the sense amplifier 150 first functions in the latch mode. During the latch mode, the control circuit 156 is configured to decouple the first inverter 172 and the second inverter 168 from the low voltage source 174 and the high voltage source 176. In this embodiment, the low voltage source 174 connects to the first inverter 172 and the second inverter 168 by way of an NMOS transistor 178, while the high voltage source 176 connects to the first inverter 172 and the second inverter 168 by way of a PMOS transistor 180. As described in more detail below, to achieve the decoupling, the control circuit 156 provides a sense strobe inner signal 182 to deactivate the NMOS transistor 178, and a sense strobe inner negated delayed signal 184 to deactivate the PMOS transistor 180. After the low voltage source 174 and the high voltage source 176 have been decoupled from the first inverter 172 and the second inverter 168, the control circuit 156 is configured to couple the bit line 152 and the reference line 154 to the second inverter 168 and the first inverter 172, respectively. More specifically, as described in more detail below, the control circuit 156 provides a sense strobe outer signal 186 and a sense strobe outer negated signal 188 to both the sense pass gate 160 and the reference pass gate 164, which function to couple and decouple the bit line 152 from the sense amplifier 150 with particular timing, thus preventing current back injection.

In this embodiment, the sense pass gate 160 is comprised of a PMOS transistor 190 and an NMOS transistor 192 disposed in parallel to each other. Likewise, the reference pass gate 164 is comprised of a PMOS transistor 194 and an NMOS transistor 196 disposed in parallel to each other. Thus, to couple the bit line 152 and the reference line 154 to the second and first inverters 168 and 172, respectively, the sense strobe outer signal 186 activates the PMOS transistors 190 and 194, while the sense strobe outer negated signal 188 activates the NMOS transistors 192 and 196. As a result, the bit line 152 voltage and the reference line 154 voltage are latched in the sense amplifier 150 during the latch mode.

With continuing reference to FIG. 5, to enter the sensing mode following the latch mode, a sense enable signal 198 is asserted on a sense enable 200 provided to the control circuit 156. In this embodiment, assertion of the sense enable signal 198 causes the sense strobe outer signal 186 to deactivate the PMOS transistors 190 and 194 in the sense pass gate 160 and the reference pass gate 164, respectively. Similarly, such assertion causes the sense strobe outer negated signal 188 to deactivate the NMOS transistors 192 and 196 in the sense pass gate 160 and the reference pass gate 164, respectively. Such a deactivation of the PMOS transistors 190 and 194 and the NMOS transistors 192 and 196 decouples the bit line 152 and the reference line 154 from the second inverter 168 and the first inverter 172, respectively. In doing so, the bit line 152 is isolated from the sense amplifier 150 during sensing, thereby preventing read disturbance of the stored state in the resistive memory bitcell caused by back injection of the sensing current onto the bit line 152.

With continuing reference to FIG. 5, assertion of the sense enable signal 198 causes the sense strobe inner signal 182 to activate the NMOS transistor 178, thereby coupling the first inverter 172 and the second inverter 168 to the low voltage source 174. As described in more detail below, such activation pulls down the latched value within the sense amplifier 150 to a lower voltage. Following the activation of the NMOS transistor 178, the sense strobe inner negated delayed signal 184 activates the PMOS transistor 180, thereby coupling the first inverter 172 and the second inverter 168 to the high voltage source 176. Importantly, the control circuit 156 is configured to delay the sense strobe inner negated delayed signal 184 in this example so that the latched value within the sense amplifier 150 is pulled down as previously described prior to being coupled to the high voltage source 176. This sequence causes the latched value to be pulled down to a lower voltage prior to completing sensing. Consequently, this allows the sense amplifier 150 to more accurately sense the stored value when the bit line 152 voltage and the reference line 154 voltage are close in value.

As a non-limiting example, when the sense amplifier 150 in FIG. 5 is in the latch mode, the bit line 152 voltage is 1.0V and the reference line 154 voltage is 0.8 V. The previously described sequence pulls the bit line 152 voltage down to 0.5 V and the reference line 154 voltage down to 0.3 V. Prior to being pulled down, the 0.2 V difference in the bit line 152 voltage and the reference line 154 voltage amounted to a variation of twenty percent (20%). However, after pulling down the bit line 152 and reference line 154 voltages, respectively, the 0.2 V voltage difference amounts to a variation of forty percent (40%). Thus, the larger percentage variation between the bit line 152 voltage and the reference line 154 voltage is more easily detected by the sense amplifier 150 in FIG. 5, even though the voltage difference remains at only 0.2 V in this example.

With continuing reference to FIG. 5, once the NMOS transistor 178 and the PMOS transistor 180 are both activated as previously described, the stored state is sensed and provided on an output 202 of the first inverter 172. More specifically, during sensing, the first inverter 172 and the second inverter 168 "compete" with one another. For example, if the bit line 152 voltage is higher than the reference line 154 voltage, the input 166 of the second inverter 168 receives a higher voltage than the input 170 of the first inverter 172. This activates an NMOS transistor 208 within the second inverter 168, causing an output 210 of the second inverter 168 to be driven to a logical '0' value. Because the output 210 of the second inverter 168 is coupled to the input 170 of the first inverter 172, the logical '0' value is provided to the first inverter 172. This activates a PMOS transistor 212 in the first inverter 172, causing the output 202 of the first inverter 172 to be driven to a logical '1' value. This indicates that a logical '1' value is stored within the resistive memory bitcell.

Conversely, if the reference line 154 voltage is higher than the bit line 152 voltage, the input 170 of the first inverter 172 receives a higher voltage than the input 166 of the second inverter 168. This activates an NMOS transistor 214 within the first inverter 172, causing the output 202 of the first inverter 172 to be driven to a logical '0' value. Because the output 202 of the first inverter 172 is coupled to the input 166 of the second inverter 168, the logical '0' value is provided to the second inverter 168. This activates a PMOS transistor 216 in the second inverter 168, causing the output 210 of the second inverter 168 to be driven to a logical '1' value. This indicates that a logical '0' value is stored within the resistive memory bitcell. Further, in this embodiment, the output 202 of the first inverter 172 is coupled to an output latch 218, which provides the stored state to a sensed output 220.

With continuing reference to FIG. 5, particular elements may be adjusted so as to improve the performance of the sense amplifier 150. For example, the first inverter 172 and the second inverter 168 may be adjusted so as to provide a lower error rate resulting from device mismatch caused by manufacturing process variations. More specifically, in this embodiment, the NMOS transistors 214 and 208 in the first and second inverters 172 and 168, respectively, have equal or substantially equal drive strengths. Similarly, the PMOS transistors 212 and 216 in the first and second inverters 172 and 168, respectively, also have equal or substantially equal drive strengths. However, in order to lower the previously described error rate, the drive strength of the NMOS transistors 214 and 208 is equal or substantially equal to four (4) times the drive strength of the PMOS transistors 212 and 216.

With continuing reference to FIG. 5, the control circuit 156 in this embodiment is now discussed in further detail. More specifically, specific circuit elements that provide the required timing for the sense amplifier 150 are described. In this regard, in this embodiment, the control circuit 156 includes an OR gate 222 and an AND gate 224. Further, the control circuit 156 includes a capacitor 226 and four inverters 228, 230, 232, and 234. Such elements are included in the control circuit 156 so as to activate circuitry within the sense amplifier 150 in the sequence previously described. For example, prior to assertion of the sense enable signal 198, the OR gate 222 provides the sense strobe outer signal 186 having a logical '0' value. The inverter 234 inverts the sense strobe outer signal 186 to generate the sense strobe outer negated signal 188. In this regard, the control circuit 156 couples the bit line 152 and the reference line 154 to the sense amplifier 150 by way of the sense pass gate 160 and the reference pass gate 164, respectively, prior to assertion of the sense enable signal 198 (e.g., during the latch mode). Further, upon assertion of the sense enable signal 198, the capacitor 226, the inverter 228, and the inverter 230 together delay the sense enable signal 198 and provide a sense enable delayed signal 236. Both signals 198 and 236 are coupled to the AND gate 224, which results in the sense strobe inner signal 182 asserting to a logical '1' value following a period of time after the assertion of the sense enable signal 198. In this regard, the sense strobe inner signal 182 does not pull down the voltage in the sense amplifier 150 until after the sense pass gate 160 and the reference pass gate 164 have decoupled the bit line 152 and the reference line 154, respectively, from the sense amplifier 150. Further, and importantly, the inverter 232 provides the delay between pulling the sense amplifier 150 down to a low voltage and connecting the sense amplifier 150 to a high voltage as previously described. In this embodiment, such a delay is produced by adjusting the inverter 232 to provide the sense strobe inner negated delayed signal 184 at a time after the inverter 232 receives the sense strobe inner signal 182. In other embodiments, the delay produced by the inverter 232 may be produced using a different element, for example, a gate. While the control circuit 156 in this embodiment includes the circuit elements as described herein, the same timing and results may be achieved in different embodiments of the control circuit 156.

Figure 6:
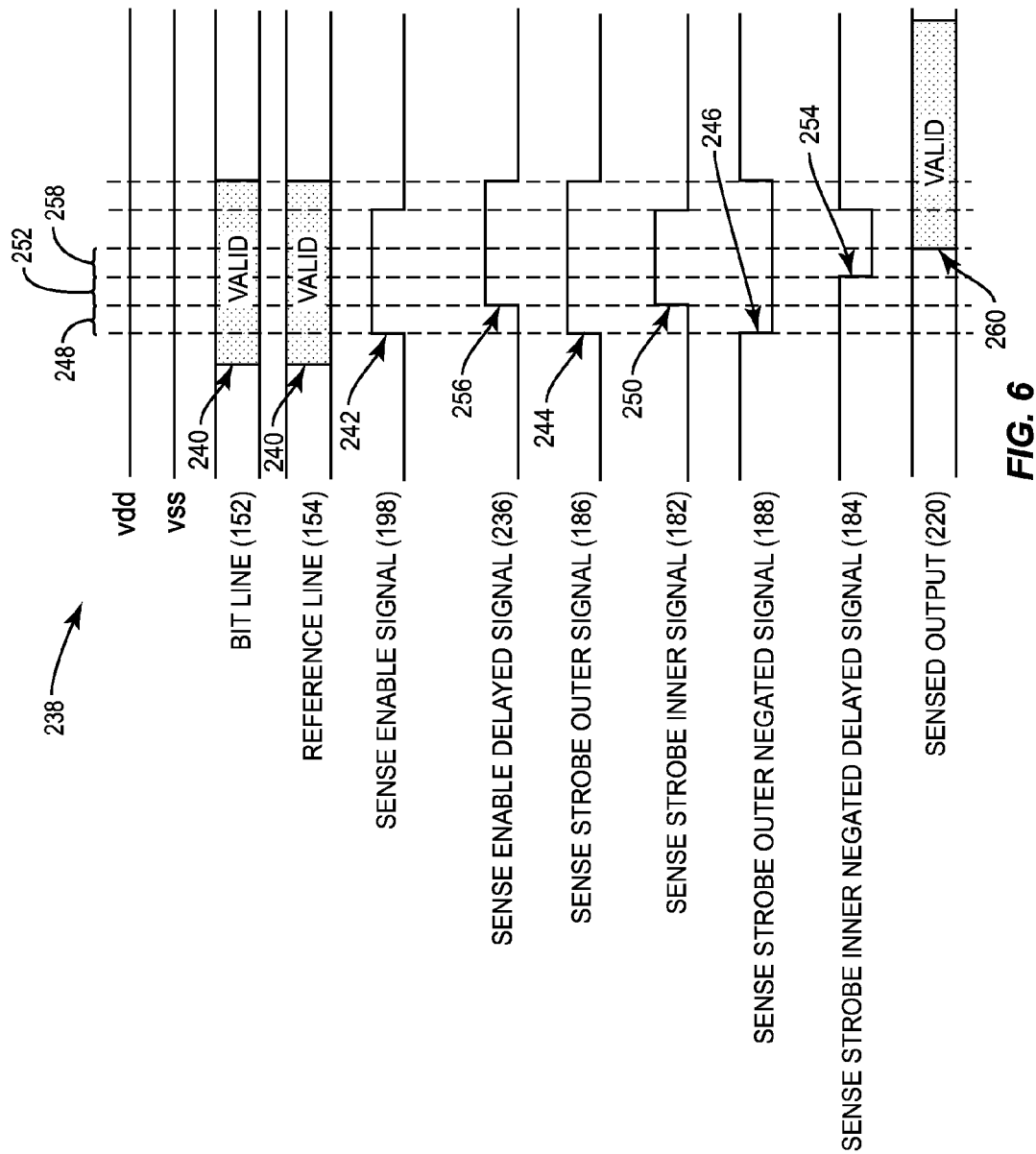
FIG. 6 is a timing diagram illustrating an exemplary timing of signals generated within the sense amplifier in FIG. 5 when performing a memory read access in a MRAM system employing the sense amplifier in FIG. 5.

In this regard, FIG. 6 illustrates an exemplary timing of signals 238 within the sense amplifier 150 in FIG. 5 generated when performing a memory read access in a MRAM system employing the sense amplifier 150. The timing of signals 238 in FIG. 6 includes certain common elements with the sense amplifier 150 in FIG. 5. Such common elements are denoted by the same number in FIG. 6 as in FIG. 5. As previously described, prior to sensing, the bit line 152 and the reference line 154 are provided to the sense amplifier 150 during the latch mode, shown by arrow 240, due to the sense strobe outer signal 186 and the sense strobe outer negated signal 188 activating the sense pass gate 160 and the reference pass gate 164, respectively. To enter the sensing mode, the sense enable signal 198 is asserted, shown by arrow 242. Upon assertion of the sense enable signal 198, the sense strobe outer signal 186 transitions to a high value, shown by arrow 244, and the sense strobe outer negated signal 188 transitions to a low value, shown by arrow 246. As previously described, this decouples the bit line 152 and the reference line 154 from the sense amplifier 150. Further, after a first delay 248, the sense strobe inner signal 182 transitions to a high value, shown by arrow 250, which pulls down the sense amplifier 150 to a low voltage, as previously described. Following a second delay 252, the sense strobe inner negated delayed signal 184 transitions to a low value, shown by arrow 254. As previously described, the second delay 252 allows the sense amplifier 150 to be pulled down to a low value prior to connecting the sense amplifier 150 to a high value so that the sensing mode can complete. Importantly, the sense enable delayed signal 236 transitions high, shown by arrow 256, after the first delay 248 provided by the capacitor 226 and the inverters 228 and 230 in FIG. 5. Finally, after a third delay 258, the stored state is sensed by the sense amplifier 150 and provided to the sensed output 220, shown by arrow 260. By using the control circuit 156 within the sense amplifier 150 in FIG. 5 to produce the timing of signals 238, the sense amplifier 150 is able to sense at lower voltage levels, while also preventing back injection, as previously described. Further, this also provides the sense amplifier 150 with a larger tolerance to overcome device mismatch due to manufacturing process variations.

In this regard, FIG. 7 is a chart 262 that illustrates fail count and sensing delay experienced during simulations within the sense amplifier 150 in FIG. 5 as compared to two exemplary CLSAs, CLSA 264 and CLSA 266, existing in the prior art. More specifically, the chart 262 details the number of times each sense amplifier design failed out of one hundred (100) simulations. Further, each simulation included one hundred (100) sense amplifiers of each design, wherein each of the one hundred (100) sense amplifiers varied in composition due to device mismatch within each sense amplifier (e.g., device mismatch was simulated to reflect manufacturing process variations). Additionally, Vm represents the voltage of the reference line 154 in FIG. 5, while Vs represents the voltage difference between the bit line 152 and the reference line 154. The voltages and timing units have been normalized from the original simulations to provide clarity. With continuing reference to the chart 262, the simulation results show that when the reference line 154 is at its lowest value, 1.0 V, and the bit line 152 equals 1.1 V, both the CLSA 264 and 266 suffer one hundred (100) fails during sensing, while requiring over one hundred forty-five (145) timing units to complete the sensing mode. However, at the same voltage levels, the sense amplifier 150 in FIG. 5 incurs zero (0) failures during sensing, and only requires 1.19 timing units to complete the sensing mode. Further, at the reference line 154 voltage of 24 V and the bit line 152 voltage of 23.9 V, the CLSA 264 suffers twenty-seven (27) failures during sensing, and requires 1.16 timing units to complete the sensing mode. Similarly, at the same voltage levels, the CLSA 266 suffers twenty-four (24) fails during sensing, and requires 1.09 timing units to complete the sensing mode. Thus, this voltage level provides the worst case scenario for the CLSAs 264 and 266. Conversely, the worst case scenario for the sense amplifier 150 occurs at the reference line 154 voltage of 24 V and the bit line 152 voltage of 24.1 V. However, even in its worst case, the sense amplifier 150 only has one (1) failure during sensing, and only requires a sensing time of 1.11 timing units. Therefore, unlike the CLSAs 264 and 266, the sense amplifier 150 provides fast sensing at all voltage levels, including lower voltage levels, while also preventing read disturbance caused by back injection. Further, unlike the CLSAs 264 and 266, the sense amplifier 150 has a high tolerance range for device mismatch due to manufacturing process variations, as the sense amplifier 150 does not produce errors during sensing even when such variations are present.

The sense amplifiers employing control circuitry for decoupling resistive memory sense inputs during state sensing to prevent current back injection according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
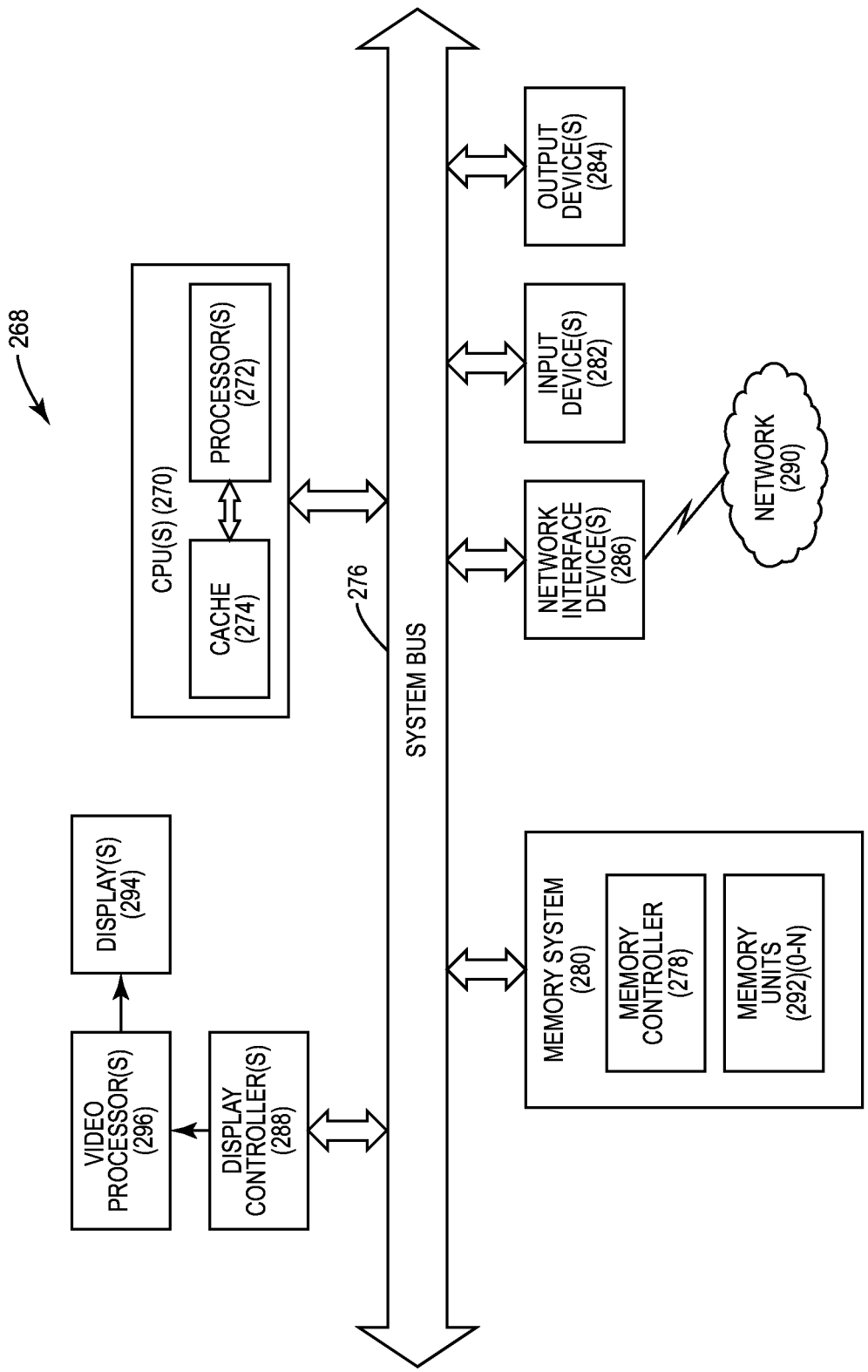
FIG. 8 is a block diagram of an exemplary processor-based system that can include the sense amplifier in FIG. 5 employing control circuitry for decoupling resistive memory sense inputs during state sensing.

In this regard, FIG. 8 illustrates an example of a processor-based system 268 that can employ the sense amplifier 150 illustrated in FIG. 5. In this example, the processor-based system 268 includes one or more central processing units (CPUs) 270, each including one or more processors 272. The CPU(s) 270 may have cache memory 274 coupled to the processor(s) 272 for rapid access to temporarily stored data. The CPU(s) 270 is coupled to a system bus 276 and can intercouple master and slave devices included in the processor-based system 268. As is well known, the CPU(s) 270 communicates with these other devices by exchanging address, control, and data information over the system bus 276. For example, the CPU(s) 270 can communicate bus transaction requests to a memory controller 278 as an example of a slave device. Although not illustrated in FIG. 8, multiple system buses 276 could be provided, wherein each system bus 276 constitutes a different fabric.

Other master and slave devices can be connected to the system bus 276. As illustrated in FIG. 8, these devices can include a memory system 280, one or more input devices 282, one or more output devices 284, one or more network interface devices 286, and one or more display controllers 288, as examples. The input device(s) 282 can include any type of input device, including but not limited to input keys, switches, voice processors, etc. The output device(s) 284 can include any type of output device, including but not limited to audio, video, other visual indicators, etc. The network interface device(s) 286 can be any devices configured to allow exchange of data to and from a network 290. The network 290 can be any type of network, including but not limited to a wired or wireless network, a private or public network, a local area network (LAN), a wide local area network (WLAN), and the Internet. The network interface device(s) 286 can be configured to support any type of communication protocol desired. The memory system 280 can include one or more memory units 292(0-N).

The CPU(s) 270 may also be configured to access the display controller(s) 288 over the system bus 276 to control information sent to one or more displays 294. The display controller(s) 288 sends information to the display(s) 294 to be displayed via one or more video processors 296, which process the information to be displayed into a format suitable for the display(s) 294. The display(s) 294 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A sense amplifier for sensing a state of a resistive memory bitcell, comprising:
   a differential sense input, the differential sense input configured to be coupled to a bit line of a resistive memory bitcell;
   a differential reference input, the differential reference input configured to be coupled to a reference line;
   a first inverter configured to invert a first inverter input into a first inverter output coupled to a second inverter input of a second inverter, the first inverter output configured to provide a sensed state of the resistive memory bitcell;
   the second inverter configured to invert the second inverter input into a second inverter output coupled to the first inverter input; and
   a control circuit configured to:
      couple the differential reference input to the first inverter and the differential sense input to the second inverter in a latch mode of the resistive memory bitcell; and
      decouple the differential reference input to the first inverter and the differential sense input to the second inverter in a sensing mode of the resistive memory bitcell to provide the sensed state of the resistive memory bitcell on the first inverter output.

2. The sense amplifier of claim 1, wherein the control circuit is further configured to decouple the first inverter from a high voltage source and a low voltage source, and decouple the second inverter from the high voltage source and the low voltage source prior to coupling the differential reference input to the first inverter and the differential sense input to the second inverter in the latch mode of the resistive memory bitcell.

3. The sense amplifier of claim 2, wherein the control circuit is further configured to:
   couple the first inverter output and the second inverter output to the low voltage source; and
   following a delay proceeding coupling the first inverter output and the second inverter output to the low voltage source, couple the first inverter output and the second inverter output to the high voltage source to provide the sensed state of the resistive memory bitcell on the first inverter output.

4. The sense amplifier of claim 3, wherein the control circuit comprises a gate configured to provide the delay proceeding coupling the first inverter output and the second inverter output to the low voltage source.

5. The sense amplifier of claim 1, wherein:
   the differential sense input comprises a sense pass gate; and the differential reference input comprises a reference pass gate.

6. The sense amplifier of claim 5, wherein:
the sense pass gate comprises an active high transistor and an active low transistor disposed in parallel to each other; and
the reference pass gate comprises an active high transistor and an active low transistor disposed in parallel to each other.

7. The sense amplifier of claim 1, wherein:
the first inverter comprises:
an active high transistor; and
an active low transistor;
the second inverter comprises:
an active high transistor; and
an active low transistor;
the active high transistor of the first inverter is configured to have a drive strength equal or substantially equal to a drive strength of the active high transistor of the second inverter;
the active low transistor of the first inverter is configured to have a drive strength equal or substantially equal to a drive strength of the active low transistor of the second inverter; and
the drive strength of the active high transistor of the first inverter is equal or substantially equal to the drive strength of the active low transistor of the first inverter multiplied by four (4).

8. The sense amplifier of claim 1, wherein the resistive memory bitcell comprises a Magnetic Random Access Memory (MRAM) bitcell.

9. The sense amplifier of claim 1, wherein the resistive memory bitcell comprises a Resistive Random Access Memory (ReRAM) bitcell.

10. The sense amplifier of claim 1 provided in an integrated circuit.

11. The sense amplifier of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

12. A memory system, comprising:
a memory array comprised of a plurality of resistive memory bitcells;
a plurality of sense amplifiers, wherein each of the plurality of sense amplifiers corresponds to a column of the memory array and is configured to sense a state of a resistive memory bitcell of the plurality of resistive memory bitcells within a selected row of the memory array of the corresponding column;
each sense amplifier of the plurality of sense amplifiers comprising:
a differential sense input, the differential sense input configured to be coupled to a bit line of the resistive memory bitcell;
a differential reference input, the differential reference input configured to be coupled to a reference line;
a first inverter configured to invert a first inverter input into a first inverter output coupled to a second inverter input of a second inverter, the first inverter output configured to provide a sensed state of the resistive memory bitcell;
the second inverter configured to invert the second inverter input into a second inverter output coupled to the first inverter input; and
a control circuit configured to:
couple the differential reference input to the first inverter and the differential sense input to the second inverter in a latch mode of the resistive memory bitcell; and
decouple the differential reference input to the first inverter and the differential sense input to the second inverter in a sensing mode of the resistive memory bitcell to provide the sensed state of the resistive memory bitcell on the first inverter output.

13. The memory system of claim 12, wherein the control circuit is further configured to decouple the first inverter from a high voltage source and a low voltage source, and decouple the second inverter from the high voltage source and the low voltage source prior to coupling the differential reference input to the first inverter and the differential sense input to the second inverter in the latch mode of the resistive memory bitcell.

14. The memory system of claim 13, wherein the control circuit is further configured to:
couple the first inverter output and the second inverter output to the low voltage source; and
following a delay proceeding coupling the first inverter output and the second inverter output to the low voltage source, couple the first inverter output and the second inverter output to the high voltage source to provide the sensed state of the resistive memory bitcell on the first inverter output.

15. The memory system of claim 14, wherein the control circuit comprises a gate configured to provide the delay proceeding coupling the first inverter output and the second inverter output to the low voltage source.

16. The memory system of claim 12, wherein:
the differential sense input comprises a sense pass gate; and
the differential reference input comprises a reference pass gate.

17. The memory system of claim 16, wherein:
the sense pass gate comprises an active high transistor and an active low transistor disposed in parallel to each other; and
the reference pass gate comprises an active high transistor and an active low transistor disposed in parallel to each other.

18. The memory system of claim 12, wherein:
the first inverter comprises:
an active high transistor; and
an active low transistor;
the second inverter comprises:
an active high transistor; and
an active low transistor;
the active high transistor of the first inverter is configured to have a drive strength equal or substantially equal to a drive strength of the active high transistor of the second inverter;
the active low transistor of the first inverter is configured to have a drive strength equal or substantially equal to a drive strength of the active low transistor of the second inverter; and the drive strength of the active high transistor of the first inverter is equal or substantially equal to the drive strength of the active low transistor of the first inverter multiplied by four (4).

19. The memory system of claim 12, wherein the memory array comprises a plurality of Magnetic Random Access Memory (MRAM) bitcells.

20. The memory system of claim 12, wherein the memory array comprises a plurality of Resistive Random Access Memory (ReRAM) bitcells.

21. A method for sensing a state of a resistive memory bitcell, comprising:
  providing a differential sense input, the differential sense input comprising a bit line of a resistive memory bitcell;
  providing a differential reference input, the differential reference input comprising a reference line;
  inverting, by a first inverter, a first inverter input into a first inverter output coupled to a second inverter input of a second inverter, the first inverter output configured to provide a sensed state of the resistive memory bitcell;
  inverting, by the second inverter, the second inverter input into a second inverter output coupled to the first inverter input;
  coupling the differential reference input to the first inverter and the differential sense input to the second inverter in a latch mode of the resistive memory bitcell; and
  decoupling the differential reference input to the first inverter and the differential sense input to the second inverter in a sensing mode of the resistive memory bitcell to provide the sensed state of the resistive memory bitcell on the first inverter output.

22. The method of claim 21, further comprising decoupling the first inverter from a high voltage source and a low voltage source, and decoupling the second inverter from the high voltage source and the low voltage source prior to coupling the differential reference input to the first inverter and the differential sense input to the second inverter in the latch mode of the resistive memory bitcell.

23. The method of claim 22, further comprising:
  coupling the first inverter output and the second inverter output to the low voltage source; and
  following a delay proceeding coupling the first inverter output and the second inverter output to the low voltage source, coupling the first inverter output and the second inverter output to the high voltage source to provide the sensed state of the resistive memory bitcell on the first inverter output.

24. The method of claim 21, wherein the resistive memory bitcell comprises a Magnetic Random Access Memory (MRAM) bitcell.

25. The method of claim 21, wherein the resistive memory bitcell comprises a Resistive Random Access Memory (ReRAM) bitcell.

* * * * *

UNITED STATES PATENT AND TRADEMARK OFFICE
CERTIFICATE OF CORRECTION

PATENT NO. : 9,087,579 B1  
APPLICATION NO. : 14/165702  
DATED : July 21, 2015  
INVENTOR(S) : Wenqing Wu et al.

Page 1 of 1

It is certified that error appears in the above-identified patent and that said Letters Patent is hereby corrected as shown below:

IN THE CLAIMS

Claim 3, at column 16, line 54, change "first inverter output" to --first inverter--.
Claim 3, at column 16, lines 54-55, change "second inverter output" to --second inverter--.
Claim 3, at column 16, lines 56-57, change "first inverter output" to --first inverter--.
Claim 3, at column 16, line 57, change "second inverter output" to --second inverter--.
Claim 3, at column 16, line 58, change "first inverter output" to --first inverter--.
Claim 3, at column 16, lines 58-59, change "second inverter output" to --second inverter--.
Claim 4, at column 16, line 64, change "first inverter output" to --first inverter--.
Claim 4, at column 16, lines 64-65, change "second inverter output" to --second inverter--.
Claim 14, at column 18, line 27, change "first inverter output" to --first inverter--.
Claim 14, at column 18, lines 27-28, change "second inverter output" to --second inverter--.
Claim 14, at column 18, lines 29-30, change "first inverter output" to --first inverter--.
Claim 14, at column 18, line 30, change "second inverter output" to --second inverter--.
Claim 14, at column 18, line 31, change "first inverter output" to --first inverter--.
Claim 14, at column 18, lines 31-32, change "second inverter output" to --second inverter--.
Claim 15, at column 18, line 38, change "first inverter output" to --first inverter--.
Claim 15, at column 18, lines 38-39, change "second inverter output" to --second inverter--.
Claim 23, at column 20, line 12, change "first inverter output" to --first inverter--.
Claim 23, at column 20, lines 12-13, change "second inverter output" to --second inverter--.
Claim 23, at column 20, lines 14-15, change "first inverter output" to --first inverter--.
Claim 23, at column 20, line 15, change "second inverter output" to --second inverter--.
Claim 23, at column 20, line 16, change "first inverter output" to --first inverter--.
Claim 23, at column 20, lines 16-17, change "second inverter output" to --second inverter--.

Signed and Sealed this  
Eighth Day of March, 2016

Michelle K. Lee  
*Director of the United States Patent and Trademark Office*